United States Patent
Uchida et al.

(10) Patent No.: US 8,681,279 B2
(45) Date of Patent: Mar. 25, 2014

(54) OPTICAL SENSOR, SEMICONDUCTOR DEVICE, AND LIQUID CRYSTAL PANEL

(75) Inventors: Seiichi Uchida, Osaka (JP); Tomohiro Kimura, Osaka (JP); Makoto Nakazawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 136 days.

(21) Appl. No.: 13/504,608

(22) PCT Filed: Jul. 16, 2010

(86) PCT No.: PCT/JP2010/062045
§ 371 (c)(1),
(2), (4) Date: May 8, 2012

(87) PCT Pub. No.: WO2011/052271
PCT Pub. Date: May 5, 2011

(65) Prior Publication Data
US 2012/0212687 A1    Aug. 23, 2012

(30) Foreign Application Priority Data

Oct. 29, 2009  (JP) ................................. 2009-248499

(51) Int. Cl.
*G02F 1/1335*  (2006.01)
*G02F 1/136*  (2006.01)

(52) U.S. Cl.
USPC .............................................. 349/12; 349/44

(58) Field of Classification Search
CPC .................................................. G02F 1/13338
USPC ...................................................... 349/12, 44
See application file for complete search history.

(56) References Cited

U.S. PATENT DOCUMENTS

| 5,510,916 A  * | 4/1996 | Takahashi ..................... 349/110 |
| 7,755,711 B2 * | 7/2010 | Kenmochi et al. .............. 349/48 |
| 2007/0200971 A1 | 8/2007 | Koide et al. |

FOREIGN PATENT DOCUMENTS

| JP | 2007-218939 A | 8/2007 |
| JP | 2008-287061 A | 11/2008 |
| JP | 2009-27035 A  | 2/2009 |

\* cited by examiner

*Primary Examiner* — James Dudek
(74) *Attorney, Agent, or Firm* — Chen Yoshimura LLP

(57) ABSTRACT

With an improved light use efficiency, the light detection sensitivity of a thin film diode is increased even if the semiconductor layer of the thin film diode has a small thickness. On one side of a substrate (101), a thin film diode (130) including a first semiconductor layer (131) that has at least an n-type region (131*n*) and a p-type region (131*p*) is provided. A light-shielding layer (160) is disposed between the substrate and the first semiconductor layer. The surface of the light-shielding layer facing the first semiconductor layer has depressions and protrusions formed thereon. The surface of the first semiconductor layer facing the light-shielding layer is flatter than the surface of the light-shielding layer on which the depressions and protrusions are formed. The light that falls on the light-shielding layer is diffusely reflected and enters the first semiconductor layer. As a result, more light enters the first semiconductor layer at larger incident angles, and the light, therefore, travels longer distances inside the first semiconductor layer. Consequently, more light is absorbed by the first semiconductor layer, and the light detection sensitivity improves accordingly.

12 Claims, 9 Drawing Sheets

__US 8,681,279 B2__

OPTICAL SENSOR, SEMICONDUCTOR DEVICE, AND LIQUID CRYSTAL PANEL

TECHNICAL FIELD

The present invention relates to an optical sensor including a thin film diode (TFD) that includes a semiconductor layer having at least an n-type region and a p-type region. Also, the present invention relates to a semiconductor device including the thin film diode and a thin film transistor (TFT). Further, the present invention relates to a liquid crystal panel having such a semiconductor device.

BACKGROUND ART

A display device can have a touch sensor function by incorporating an optical sensor including a thin film diode into it. The data entry system of such a display device is based on the detection of the change in the light projected through the display device surface on the side of the user (i.e., display surface), which occurs when the display surface is touched with a finger or a touch pen.

With such a display device, the change in the light due to the touch on the display surface with a finger or the like can be small depending on the surrounding condition such as the ambient brightness. Therefore, in that case, the change in the light cannot be detected accurately by the optical sensor.

Japanese Patent Application Laid-Open Publication No. 2008-287061 discloses a technology that improves the light detection sensitivity of an optical sensor of a semiconductor device for use in a liquid crystal display device. This is described with reference to FIG. 8.

This semiconductor device has, over the substrate (active matrix substrate) 910, insulating layers 941, 942, 943, and 944, which are formed sequentially, a thin film diode 920, and a thin film transistor 930. The thin film diode 920 is a PIN-type diode having a semiconductor layer 921 composed of an n-type region 921n, a p-type region 921p, and a low-resistance region 921i. The thin film transistor 930 has a semiconductor layer 931 composed of a channel region 931c, an n-type region 931a as the source region, an n-type region 931b as the drain region. A gate electrode 932 is disposed facing the channel region 931c through an insulating layer 943. The n-type region 931b is connected to the pixel electrode (not shown).

The thin film diode 920 receives the light projected from the display side (upper side of FIG. 8). On the other hand, in order to block the light from the backlight (not shown) disposed on the other side of the substrate 910, which is the side opposite from the display (lower side of FIG. 8), from entering the thin film diode 920, a light-shielding layer 990 is provided between the thin film diode 920 and the substrate 910. The light-shielding layer 990 is formed to extend along the surface of a recess 992 formed by partially removing the insulating layer 941. Because the recess 992 tapers outward toward the top, the light-shielding layer 990 has a sloped surface 991 extending along the sloped surface of the recess 992.

The light-shielding layer 990 also functions as a reflective layer. Therefore, the light that entered through the display surface and then, instead of entering the thin film diode 920, fell between the thin film diode 920 and the light-shielding layer 990 is reflected by the light-shielding layer 990 and goes back to enter the thin film diode 920. The sloped surface 991 of the light-shielding layer 990 reflects the light that falls on the sloped surface 991 toward the thin film diode 920.

In the semiconductor device shown in FIG. 8, with the light-shielding layer 990 described above, more light that enters through the display surface is guided into the thin film diode 920. As a result, the light detection sensitivity can be improved.

SUMMARY OF THE INVENTION

However, sufficient light detection sensitivity cannot be obtained even from the semiconductor device shown in FIG. 8. The reason is described below.

The semiconductor layer 921 of the thin film diode 920 is formed at the same time with the semiconductor layer 931 of the thin film transistor 930. Thus, the film thickness of the semiconductor layer 921 is extremely small. As a result, part of the light that went into the semiconductor layer 921 passes through the semiconductor layer 921, instead of being absorbed by the semiconductor layer 921. Consequently, even if the light that fell between the thin film diode 920 and the light-shielding layer 990 is reflected by the sloped surface 991 toward the semiconductor layer 921, there is a possibility that part of the light that is reflected toward the semiconductor layer 921 is not absorbed by the semiconductor layer 921, but passes through the semiconductor layer 921. Furthermore, the sloped surface 991 is formed only near the edge of the light-shielding layer 990. Therefore, most light reflected by the sloped surface 991 enter the region along the border of the thin film diode 920. As a result, only a small portion of the light enters the low-resistance region 921i, which is a light-receiving region.

The present invention is aiming at solving the above-mentioned problems found in conventional devices and improving the light detection sensitivity of the thin film diode by increasing the light use efficiency even if the semiconductor layer of the thin film diode is thin.

An optical sensor of the present invention includes a substrate, a thin film diode disposed on one side of the substrate and including a first semiconductor layer having at least an n-type region and a p-type region, and a light-shielding layer disposed between the substrate and the first semiconductor layer. The surface of the light-shielding layer that is facing the first semiconductor layer has depressions and protrusions formed thereon. The surface of the first semiconductor layer that is facing the light-shielding layer is flatter than the surface of the light-shielding layer on which depressions and protrusions are formed.

In the present invention, the surface of the light-shielding layer that is facing the first semiconductor layer has depressions and protrusions formed thereon. As a result, the light that falls on the light-shielding layer is diffusely reflected by the depressions and protrusions of the light-shielding layer, and then enters the first semiconductor layer. Therefore, light of various incident angles enter the first semiconductor layer. In this case, compared to the case where depressions and protrusions are not formed on the light-shielding layer, more light enters the first semiconductor layer with larger incident angles. Thus, the light reflected by the light-shielding layer travels longer distances inside the first semiconductor layer. As a result, more light is absorbed by the first semiconductor layer. Consequently, even if the first semiconductor layer is thin, the light use efficiency is improved and the light detection sensitivity is improved accordingly.

The surface of the first semiconductor layer that faces the light-shielding layer is flatter than the surface of the light-shielding layer that has depressions and protrusions formed thereon. Therefore, when the first semiconductor layer is crystallized by laser light radiation, for example, inconsistent crystallization or irregular layer thickness can be suppressed. As a result, a high-quality first semiconductor layer can consistently be obtained.

DETAILED DESCRIPTION OF EMBODIMENTS

Figure 1:
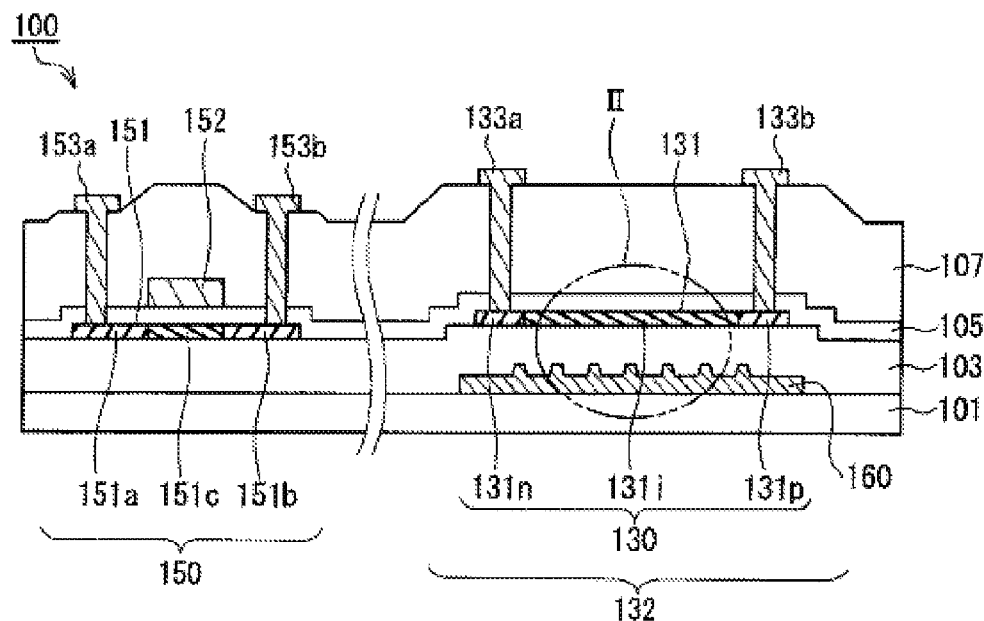
FIG. 1 is a cross-sectional view schematically showing the configuration of a semiconductor device according to Embodiment 1 of the present invention.

An optical sensor according to an embodiment of the present invention includes a substrate, a thin film diode disposed on one side of the substrate and including a first semiconductor layer having at least an n-type region and a p-type region, and a light-shielding layer disposed between the substrate and the first semiconductor layer. A surface of the light-shielding layer that is facing the first semiconductor layer has depressions and protrusions formed thereon, and the surface of the first semiconductor layer that is facing the light-shielding layer is flatter than the surface of the light-shielding layer with depressions and protrusions formed thereon (Configuration 1).

In Configuration 1, depressions and protrusions are formed on the surface of the light-shielding layer facing the first semiconductor layer. As a result, the light that falls on the surface of the light-shielding layer facing the first semiconductor layer is diffusely reflected.

On the other hand, the surface of the first semiconductor layer that faces the light-shielding layer is flatter than the surface of the light-shielding layer that has depressions and protrusions formed thereon. Therefore, when the first semiconductor layer is crystallized by laser light radiation, for example, inconsistent crystallization and uneven layer thickness can be suppressed. As a result, a high-quality first semiconductor layer can consistently be obtained.

Whether the surface of the first semiconductor layer facing the light-shielding layer is flatter than the surface of the light-shielding layer that has depressions and protrusions formed thereon can easily be determined by, for example, observing a cross section in the direction of the thickness with SEM (hereinafter referred to as "SEM observation of the cross section"). Through the SEM observation of the cross section, the comparative flatness of the surfaces can be evaluated by, for example, comparing the difference in height between the top and the base of the depressions and protrusions of one surface with that of the other surface.

In Configuration 1, the difference in height between the top and the base of the depressions and protrusions formed on the surface of the light-shielding layer facing the first semiconductor layer is preferably 50 to 100 nm (Configuration 2). If the above-mentioned difference in height of the protrusion of the light-shielding layer is smaller than this value range, the light that falls on the light-shielding layer is less likely to be diffusely reflected into various directions. As a result, the effect of the thin film diode for the improvement of the light detection sensitivity can be compromised. If the difference in height between the top and the base of the depressions and protrusions formed on the light-shielding layer is greater than this value range, the flatness of the surface of the first semiconductor layer facing the light-shielding layer can be deteriorated. In that case, the first semiconductor layer tends to exhibit uneven surface that matches the unevenness of the light-shielding layer surface. As a result, when crystallizing the first semiconductor layer with the laser light radiation, for example, crystallinity and the thickness of the layer tend to become uneven. The level difference of light-shielding layer surface can be measured, for example, by SEM observation of cross sectional images.

In Configuration 1 or 2, the difference in height between the top and the base of the first semiconductor layer surface facing the light-shielding layer is preferably no more than 1/10 of the thickness of the first semiconductor layer (Configuration 3). If the difference in height between the top and the base of the first semiconductor layer surface facing the light-shielding layer is larger than 1/10 of the thickness of the first semiconductor layer, the flatness of the first semiconductor layer surface facing the light-shielding layer is deteriorated. Thus, the first semiconductor layer tends to exhibit uneven surface that matches the unevenness of the light-shielding layer surface. As a result, when crystallizing the first semiconductor layer using the laser light, for example, the crystallinity and the thickness of the layer tend to become uneven. The difference in height between the top and the base of the depressions and protrusions of light-shielding layer can be measured, for example, by SEM observation of cross section images.

In any one of Configurations 1 to 3, preferably an insulating layer having a thickness of at least 500 nm is disposed between the light-shielding layer and the first semiconductor layer (Configuration 4). An insulating layer having this thickness allows the first semiconductor layer surface facing the light-shielding layer to be flat while the difference in height between the top and the base of the depressions and protrusions formed on the light-shielding layer surface facing the first semiconductor layer is maintained.

In any one of Configurations 1 to 4, preferably the depressions and protrusions are formed over the entire light-shielding layer surface facing the first semiconductor layer (Configuration 5). In this case, of the area of the light-shielding layer surface facing the first semiconductor layer, the area that can diffusely reflect the light can be increased. Thus, the light that falls on the light-shielding layer is diffusely reflected regardless of the location at which the light falls. As a result, the light detection sensitivity of the thin film diode can further be improved. Also, compared to the case where the depressions and protrusions are formed only in a limited area, the formation process of the depressions and protrusions can, in some cases, be simplified.

In any of Configurations 1 to 5, the depressions and protrusions formed on the light-shielding layer surface that is facing the first semiconductor layer are preferably arranged regularly (Configuration 6). This way, effective and desired depressions and protrusions that diffusely reflect the light can easily be formed. Alternatively, the depressions and protrusions on the light-shielding layer surface facing the first semiconductor layer may be arranged in an irregular manner.

The semiconductor device according to an embodiment of the present invention includes: the optical sensor according to an embodiment of the present invention described above; and a thin film transistor formed on the substrate on the same side as the thin film diode. The thin film transistor has a second semiconductor layer that includes a channel region, a source region, and a drain region; a gate electrode that controls a conductivity of the channel region; and a gate insulating film disposed between the second semiconductor layer and the gate electrode (Configuration 7). In Configuration 7, a thin film diode and a thin film transistor are disposed on a common substrate. As a result, the semiconductor device according to an embodiment of the present invention can be used for a wide variety of purposes in which the light detection function is required.

In Configuration 7, the first semiconductor layer and the second semiconductor layer are preferably formed on the same insulating layer (Configuration 8). This way, the first semiconductor layer and the second semiconductor layer can be formed simultaneously in the same process. As a result, the manufacturing process can be simplified.

In Configuration 7 and Configuration 8, the surface of the second semiconductor layer facing the substrate is preferably flat (Configuration 9). This way, the light detection sensitivity of the thin film diode can be improved without negatively influencing the gate voltage resistance characteristics and the like of the thin film transistor. The surface of the second semiconductor layer facing the substrate does not have to be perfectly flat, but only needs to be substantially flat.

In any one of Configurations 7 to 9, the thickness of the first semiconductor layer and the thickness of the second semiconductor layer are preferably the same (Configuration 10). This way, the first semiconductor layer and the second semiconductor layer can be formed simultaneously in the same process. As a result, the manufacturing process can be simplified.

A liquid crystal panel according to an embodiment of the present invention includes: the semiconductor device; an opposite substrate disposed facing the substrate surface on which the thin film diode and the thin film transistor are formed; and a liquid crystal layer sealed in between the substrate and the opposite substrate (Configuration 11). This way, a liquid crystal display device having a touch sensor function and/or an ambient sensor function that detects the ambient brightness can be realized.

Below, the present invention is described in detail using preferred embodiments. It should be noted, however, the present invention is not limited to the embodiments described below. For simplicity, the figures referenced in the description below schematically show only the main members necessary to describe the present invention. Therefore, the present invention may include constituting members other than those shown in the figures below. Also, dimensions of the members shown in the figures below do not accurately represent the dimensions or dimensional ratios of the actual constituting members.

Embodiment 1

FIG. 1 is a cross-sectional view schematically showing the configuration of a semiconductor device 100 according to Embodiment 1 of the present invention. The semiconductor device 100 includes: a substrate 101; an optical sensor 132 that includes a thin film diode 130 formed over the substrate 101 through a base layer 103 as the insulating layer, and a light-shielding layer 160 disposed between the substrate 101 and the thin film diode 130; and a thin film transistor 150. The substrate 101 is preferably transparent. For simplicity, in FIG. 1, only a single optical sensor 132 and a single thin film transistor 150 are shown. However, a plurality of optical sensors 132 and a plurality of thin film transistors 150 may be formed on the common substrate. Also, for easier understanding, a cross-sectional view of the optical sensor 132 and a cross-sectional view of the thin film transistor 150 are shown in the same figure. However, these cross-sectional views do not need to be in a single, common plane.

The thin film diode 130 includes a semiconductor layer (first semiconductor layer) 131 that has at least an n-type region 131n and a p-type region 131p. In this Embodiment, an intrinsic region 131i is disposed between the n-type region 131n and the p-type region 131p of the semiconductor layer 131. Electrodes 133a and 133b are connected to the n-type region 131n and the p-type region 131p, respectively.

The thin film transistor 150 includes: a semiconductor layer (second semiconductor layer) 151 having a channel region 151c, a source region 151a, and a drain region 151b; a gate electrode 152 that controls the conductivity of the channel region 151c; and a gate insulating film 105 disposed between the semiconductor layer 151 and the gate electrode 152. To the source region 151a and the drain region 151b, electrodes 153a and 153b are connected, respectively. The gate insulating film 105 extends to cover the semiconductor layer 131.

The crystallinity of the semiconductor layer 131 of the thin film diode 130 and the crystallinity of the semiconductor layer 151 of the thin film transistor 150 may be different from each other or may be the same. If the crystallinity of the semiconductor layer 131 and the crystallinity of the semiconductor layer 151 are to be the same, the state of crystallization of the semiconductor layers 131 and the state of crystallization of the semiconductor layer 151 do not need to be controlled separately. As a result, a highly-reliable and high-performance semiconductor device 100 can be obtained without increasing the complexity of the manufacturing process.

An interlayer insulating film 107 is formed over the thin film diode 130 and the thin film transistor 150.

The light-shielding layer 160 is disposed between the substrate 101 and the thin film diode 130. More specifically, the light-shielding layer 160 is disposed over the substrate 101 at a location facing the semiconductor layer 131. This way, the light that passes through the substrate 101 from the side away from the thin film diode 130 is prevented from entering the semiconductor layer 131.

The surface of the light-shielding layer 160 that faces the thin film diode 130 (the top surface) has depressions and protrusions formed thereon. On the other hand, the surface of the semiconductor layer 131 of the thin film diode 130 that faces the light-shielding film 160 is flatter than the top surface of the light-shielding film 160, and, preferably, is substantially flat.

Figure 2:
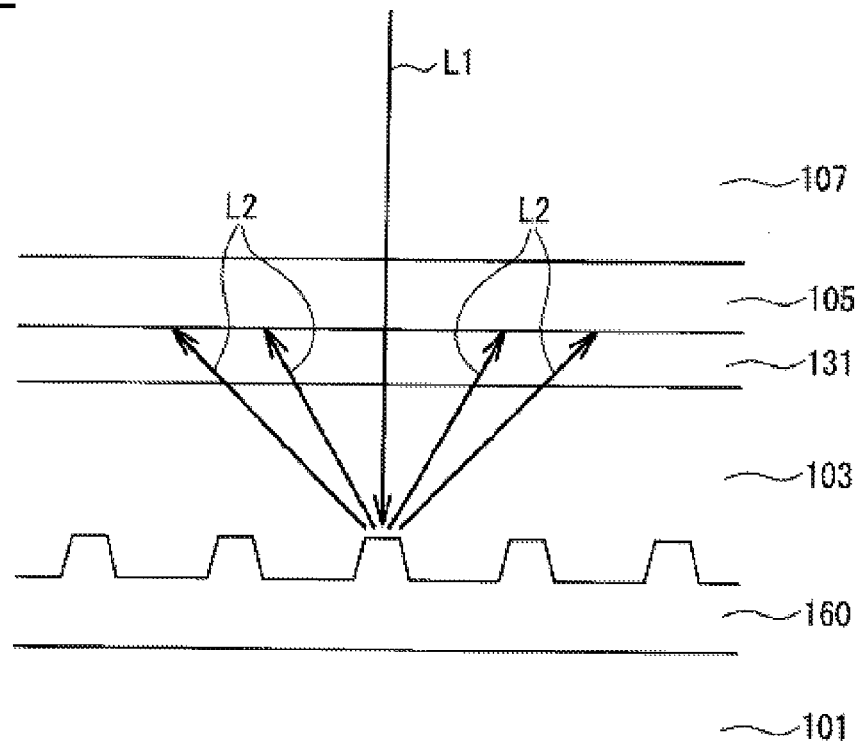
FIG. 2 is a magnified cross-sectional view of portion II of FIG. 1 is for describing how the light detection sensitivity of the thin film diode is improved in the semiconductor device according to Embodiment 1 of the present invention.

The function of the depressions and protrusions of the top surface of the light-shielding layer 160 is described. FIG. 2 is a magnified cross-sectional view of portion II of FIG. 1 that includes the light-shielding layer 160 and the semiconductor layer 131. Light L1 that proceeds to the thin film diode 130 from the top enters the semiconductor layer 131 of the thin film diode 130, and is absorbed by the semiconductor layer 131. However, because the semiconductor layer 131 is thin, part of the incoming light L1 passes through the semiconductor layer 131. The light L1 that has passed through the semiconductor layer 131 then passes through the base layer 103, and falls on the top surface of the light-shielding layer 160. Because the top surface of the light-shielding layer 160 has depressions and protrusions formed thereon, the light-shielding layer 160 diffusely reflects the incoming light L1. Reflected light L2 that has been diffusely reflected passes through the base layer 103 and enters the semiconductor layer 131. The reflected light L2 is the incoming light L1 after being reflected at various reflection angles, and the reflected light L2, therefore, enters the semiconductor layer 131 at various incident angles. Here, compared to the case where no protrusion is formed on the top surface of the light-shielding layer 160, more reflected light L2 enters the light semiconductor layer 131 at large incident angles. The larger the incident angle of the reflected light L2 to the semiconductor layer 131, the longer the distance that the reflected light L2 travels inside the semiconductor layer 131. As a result, more light is absorbed by the semiconductor layer 131. Also, the reflected light L2 is the incoming light L1 reflected at various reflection angles. Therefore, even if part of the reflected light L2 passes through the semiconductor layer 131, the chance that the reflected light L2 that passed through the semiconductor layer 131 is reflected against the peripheral members of the semiconductor layer 131 (ex. electrodes 133a and 133b) and re-enters the semiconductor layer 131 increases. As a result, the amount of the light absorbed by the semiconductor layer 131 increases, the light use efficiency is improved, and the light detection sensitivity of the thin film diode 130 is enhanced.

As apparent from the description above, according to the present invention, even if the semiconductor layer 131 is so thin that most incoming light L1 passes through the semiconductor layer 131, the reflected light L2 travels longer distances inside the semiconductor layer 131. This way, the light detection sensitivity of the thin film diode 130 can be improved. Therefore, the semiconductor layer 131 does not need to be made thick to reduce the amount of the light that passes through the semiconductor layer 131. As a result, as described below, the semiconductor layer 131 can be formed in the same process as the semiconductor layer 151 of the thin film transistor 150.

Depressions and protrusions are preferably formed over the entire top surface of the light-shielding layer 160. This way, regardless of the location on the light-shielding layer 160 at which the incoming light L1 falls, the light detection sensitivity of the thin film diode 130 can be improved. Also, there is no need to restrict the region in which the depressions and protrusions are to be formed. As a result, the process of forming the depressions and protrusions can be simplified.

An example of the method for manufacturing the semiconductor device 100 of this embodiment, which is configured as discussed above, is described below. However, the method for manufacturing the semiconductor device 100 is not limited to the example described below.

Figure 3A:
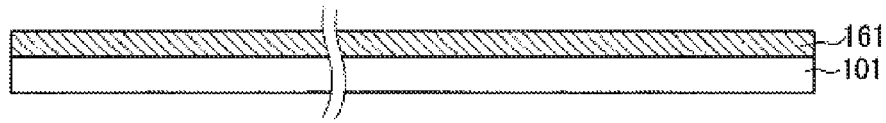
FIG. 3A is a cross-sectional view showing one manufacturing step of a semiconductor device according to Embodiment 1 of the present invention.

First, as shown in FIG. 3A, a thin film 161 that will be the light-shielding layer 160 is formed on the substrate 101.

The substrate 101 is not particularly limited and can be appropriately selected based on the purpose and the like of the semiconductor device 100. For example, a transparent glass substrate (a low alkali glass substrate, for example) or a quartz substrate may be used. If a low alkali glass substrate is used as the substrate 101, the substrate 101 can be thermally pre-treated at a temperature lower than the glass strain point by about 10 to 20° C.

As the material for the thin film 161, a metal material, for example, can be used. In particular, metals with a high melting point such as tantalum (Ta), tungsten (W), and molybdenum (Mo) are preferred in consideration of the heat treatment that is performed later in the manufacturing process. The metal material is deposited over the entire surface of the substrate 101 by sputtering. The thickness of the thin film 161 is preferably 200 to 300 nm.

Figure 3B:
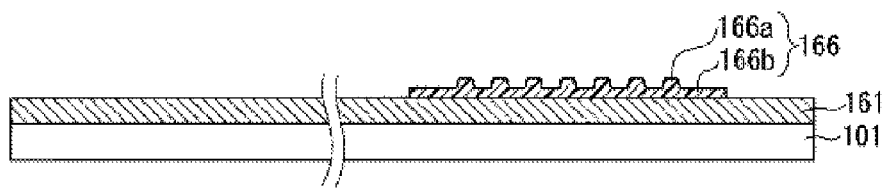
FIG. 3B is a cross-sectional view showing one manufacturing step of the semiconductor device according to Embodiment 1 of the present invention.

Next, as shown in FIG. 3B, a resist is applied over the entire surface of the thin film 161, and the exposure is conducted through a halftone mask, and then the development is performed. This way, the resist layer 166 is formed only in the region where the light-shielding film 160 is to be formed. The resist layer 166 has a continuous base layer 166b. On the top surface of the base layer 166b, depressions and protrusions 166a are formed at locations where the depressions and protrusions will be formed on the top surface of the light-shielding film 160.

Figure 3C:
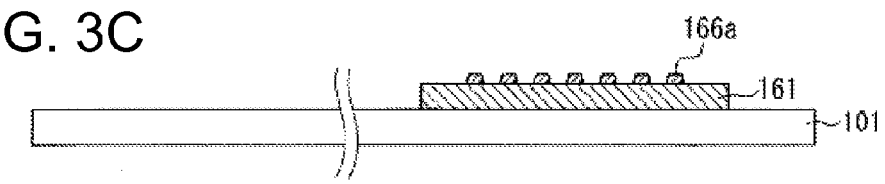
FIG. 3C is a cross-sectional view showing one manufacturing step of the semiconductor device according to Embodiment 1 of the present invention.

Next, a dry etching is performed to remove the thin film 161 in the unnecessary regions, which are not covered by the resist layer 166. After this, the thin film 161 in the region in which the thin film diode 130 will be formed remains. The thin film 161 outside the region where the thin film diode 130 will be formed, including the region where the thin film transistor 150 will be formed, is removed. Then, as shown in FIG. 3C, the base layer 166b of the resist layer 166 is removed, and the half-ashing is performed to preserve the depressions and protrusions 166a.

Figure 3D:
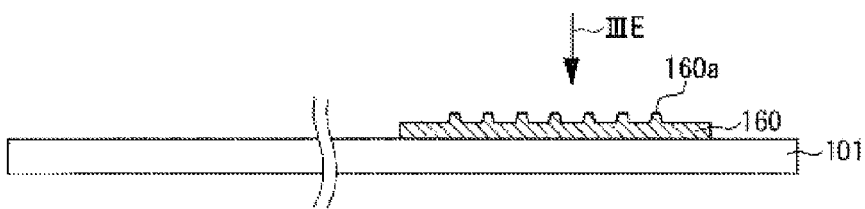
FIG. 3D is a cross-sectional view showing one manufacturing step of the semiconductor device according to Embodiment 1 of the present invention.
Figure 3E:
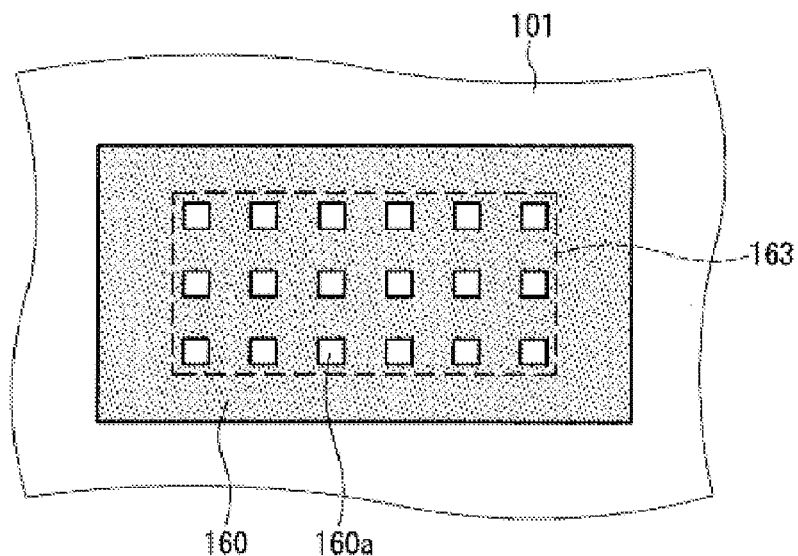
FIG. 3E is a plan view of the light-shielding film observed from the direction indicated by the arrow IIIE of FIG. 3D.

Next, the dry etching is performed to remove the surface layer of the thin film 161 at locations not covered by the depressions and protrusions 166a. Then, ashing is performed to remove and peel off the depressions and protrusions 166a to obtain the light-shielding film 160 as shown in FIG. 3D. FIG. 3E is a plan view of the light-shielding film 160 observed from the direction of the arrow IIIE of FIG. 3D. On the top surface of the light-shielding film 160, at locations where the depressions and protrusions 166a were formed, depressions and protrusions 160a are now formed as unified portions of the light-shielding film 160. The height of the protrusion 160a, i.e., the difference in height between the top surface (that is, the top of the protrusion 160a) and the base surface of the light-shielding film 160 is not particularly limited, but is preferably 50 to 100 nm. Also, the thickness of the light-shielding film 160 is preferably at least 100 nm where no depressions and protrusions 160a are formed (i.e., the base portion). As shown in FIG. 3E, in this embodiment, depressions and protrusions 160a are arranged apart from each other and in a regular manner on the top surface of the light-shielding film 160 in a region 163 facing the intrinsic region 131i of the first semiconductor layer 131, which will be formed later. The depressions and protrusions 160a may be formed over the entire top surface of the light-shielding film 160.

Figure 3F:
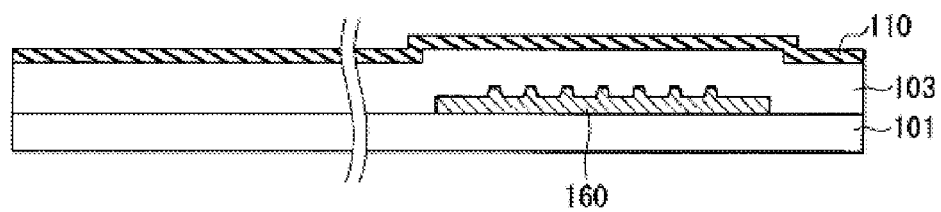
FIG. 3F is a cross-sectional view showing one manufacturing step of the semiconductor device according to Embodiment 1 of the present invention.

Next, as shown in FIG. 3F, a base layer (insulating layer) 103 is formed to cover the substrate 101 and the light-shielding layer 160, and, further, an amorphous semiconductor film 110 is formed.

The base layer 103 is provided to prevent the diffusion of the impurities from the substrate 101. The base layer 103 may be configured to be a single layer of a silicon oxide film, for example, or a multi-layer structure composed of, from the side of the substrate 101, a silicon nitride film and a silicon oxide film. Other known configurations may also be employed. The base layer 103 can be formed with the plasma CVD method, for example.

The thickness of the base layer 103 is not particularly limited, but is preferably at least 500 nm, and more preferably at least 600 nm. If the base layer 103 is too thin, in the region where the light-shielding film 160 is formed, depressions and protrusions are formed on the top surface of the base layer 103 (i.e., the bottom surface of the amorphous semiconductor film 110) due to the presence of depressions and protrusions on the top surface of the light-shielding film 160, with about the same height as the depressions and protrusions on the light-shielding film 160. By forming the base layer 103 with a thickness as stated above, in the region where the light-shielding film 160 has been formed, the top surface of the base layer 103 can be made substantially flat. Specifically, in the region where the light-shielding film 160 has been formed, any level difference of the top surface of the base layer 103 (i.e., the bottom surface of the amorphous semiconductor film 110) is preferably no more than 1/10 of the thickness of the amorphous semiconductor film 110.

As a semiconductor constituting the amorphous semiconductor film 110, preferably silicon is used. However, a semiconductor other than silicon, such as Ge, SiGe, a composite semiconductor, and chalcogenide may also be used. The case where silicon is used is described below. The amorphous silicon film 110 is formed with a known method such as the plasma CVD or sputtering. The thickness of the amorphous silicon film 110 is preferably 25 to 100 nm, and more preferably 50 to 100 nm. With these film thicknesses, crystallization by the laser radiation can be effectively performed to realize a high-quality polycrystalline silicon, which is the next step. For example, a 50 nm-thick amorphous silicon film 110 may be formed with the plasma CVD method. If the base layer 103 and the amorphous silicon film 110 are to be formed with the same deposition method, the base layer 103 and the amorphous silicon film 110 may be continuously formed. In this case, the surface contamination of the base layer 103 can be prevented by not exposing the base layer 103 to the atmosphere after it is formed. As a result, the characteristics of the thin film transistor 150 and the thin film diode 130 to be formed can be made more consistent and also the fluctuation of the threshold voltage can be suppressed.

Figure 3G:
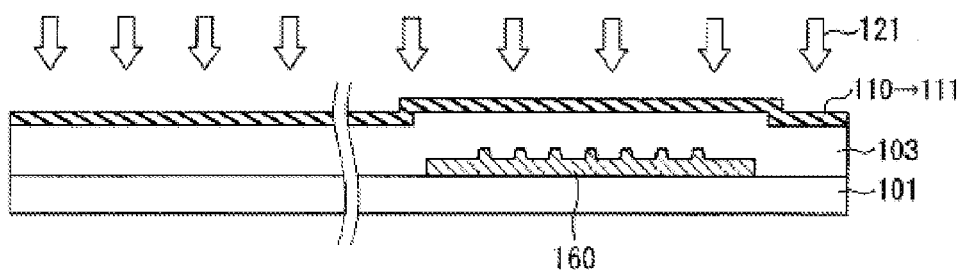
FIG. 3G is a cross-sectional view showing one manufacturing step of the semiconductor device according to Embodiment 1 of the present invention.

Next, as shown in FIG. 3G, laser light 121 is projected over the amorphous silicon film 110 from the top to crystallize the amorphous silicon film 110. The laser light 121 may be XeCl excimer laser (wavelength: 308 nm, pulse width: 40 nsec) or KrF excimer laser (wavelength: 248 nm, pulse width: 20 to 30 nsec). The laser light 121 is adjusted to from an irradiation area of an elongated rectangular shape on the surface of the substrate 101. Scanning using the laser light 121 is conducted sequentially in the direction perpendicular to the direction of the long side of the irradiation area of the laser light 121 projected on the substrate 101 surface to crystallize the entire amorphous silicon film 110. Here, the scanning is preferably performed such that the irradiation area of the scanned laser light 121 partially overlap with each other. This way, any given point on the amorphous silicon film 110 is irradiated with the laser light multiple times. As a result, the crystal condition of the polycrystalline silicon film 111 can be made more uniform. By being irradiated with the laser light 121, the amorphous silicon film 110 melts instantly and is crystallized in the solidification process to become a polycrystalline silicon film 111. As discussed above, in the region where the light-shielding film 160 is formed, any level difference of the top surface of the base layer 103 (i.e., the bottom surface of the amorphous semiconductor film 110) is preferably no more than 1/10 of the thickness of the amorphous semiconductor film 110, because within this limit, inconsistent crystallization and uneven layer thickness that otherwise can occur when the amorphous silicon film 110 is crystallized can be prevented.

Figure 3H:
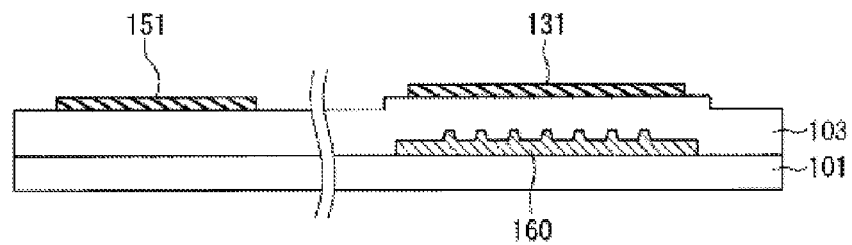
FIG. 3H is a cross-sectional view showing one manufacturing step of the semiconductor device according to Embodiment 1 of the present invention.

Next, as shown in FIG. 3H, unnecessary regions of the polycrystalline silicon film 111 are removed to separate elements. The elements separation can be conducted by photolithography, i.e., by removing the polycrystalline silicon film 111 of the unnecessary regions with dry-etching after a resist of a prescribed pattern is formed. This way, the semiconductor layer 131, which will become the active regions (n-type region 131n, p-type region 131p, and intrinsic region 131i) of the thin film diode 130, and the semiconductor layer 151, which will become the active regions (source region 151a, drain region 151b, and channel region 151c) of the thin film transistor 150, are formed and isolated from each other. That is, each of the semiconductor layers 131 and 151 is formed in an island shape.

Figure 3I:
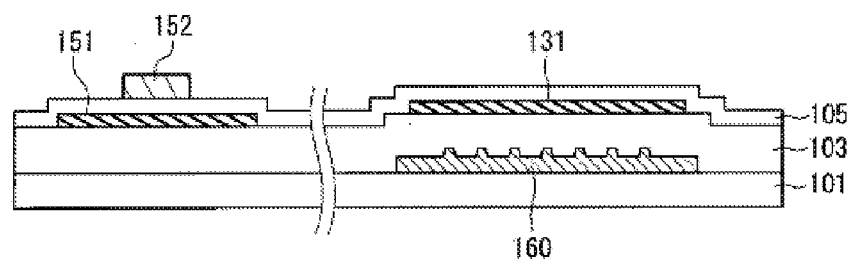
FIG. 3I is a cross-sectional view showing one manufacturing step of the semiconductor device according to Embodiment 1 of the present invention.

Next, as shown in FIG. 3I, a gate insulating film 105 is formed to cover the island-shaped semiconductor layers 131 and 151, and then a gate electrode 152 of the thin film transistor 150 is formed on the gate insulating film 105. The gate insulating film 105 is preferably a silicon oxide film. The thickness of the gate insulating film 105 is preferably 20 to 150 nm (100 nm, for example).

The gate electrode 152 is formed by depositing a conductive film over the entire surface of the gate insulating film 105 with sputtering, CVD, or like method, and then patterning the conductive film. The preferred material for the conductive film material is W, Ta, Ti, or Mo, all of which are metals with a high-melting point, or an alloy of these metals. The thickness of the conductive film is preferably 300 to 600 nm.

Figure 3J:
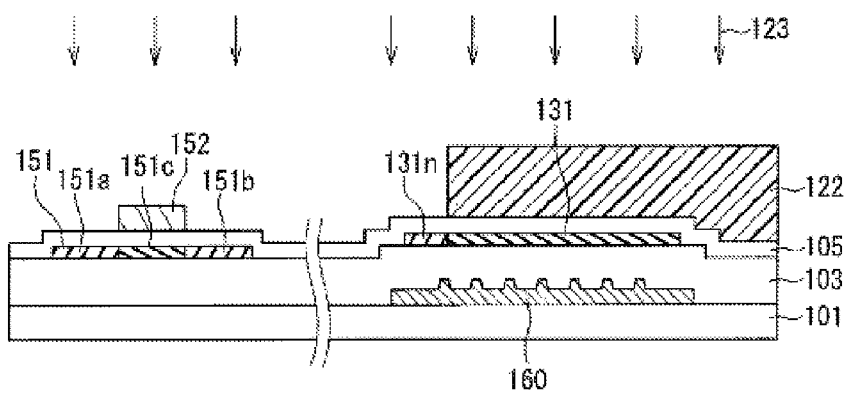
FIG. 3J is a cross-sectional view showing one manufacturing step of the semiconductor device according to Embodiment 1 of the present invention.

Next, as shown in FIG. 3J, a mask 122 made of a resist is formed on the gate insulating film 105 to cover a portion of the semiconductor layer 131 that will be the active region of the thin film diode 130. Then, in this state, from over the substrate 101, an n-type impurity (phosphorus, for example) 123 is doped into the entire substrate 101. The n-type impurity 123 passes through the gate insulating film 105 and is implanted into the semiconductor layers 151 and 131. Through this process, n-type impurity 123 is implanted into the region in the semiconductor layer 131 of the thin film diode 130 that is not covered by the mask 122, and the regions in the semiconductor layer 151 of the thin film transistor 150 that are not covered by the gate electrode 152. The n-type impurity 123 is not doped into the region covered by the mask 122 and the region covered by the gate electrode 152. Thus, the region in the semiconductor layer 131 of the thin film diode 130 into which the n-type impurity 123 has been implanted will be the n-type region 131n of the thin film diode 130. Also, the regions in the semiconductor layer 151 of the thin film transistor 150 into which the n-type impurity 123 has been implanted will be the source region 151a and drain region 151b of the thin film transistor 150. The region of the semiconductor layer 151 that is covered with the gate electrode 152 and therefore into which the n-type impurity 123 is not implanted will be the channel region 151c of the thin film transistor 150.

Figure 3K:
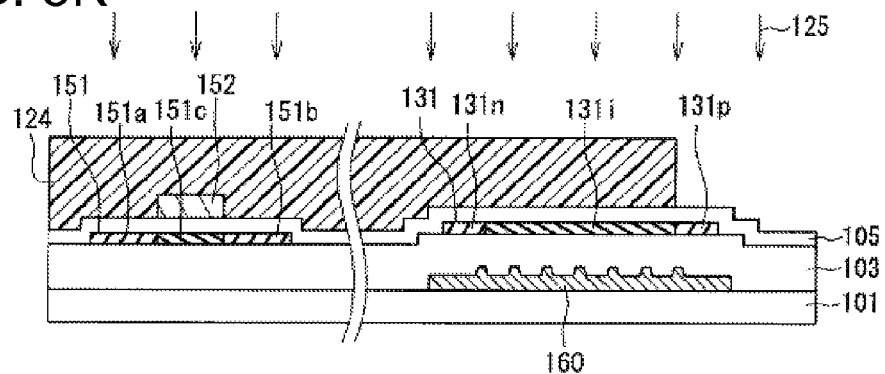
FIG. 3K is a cross-sectional view showing one manufacturing step of the semiconductor device according to Embodiment 1 of the present invention.

Next, the mask 122 is removed, and then, as shown in FIG. 3K, a mask 124 made of a resist is formed on the gate insulating film 105 to cover the portion of the semiconductor layer 131 that will be the active region of the thin film diode 130, and to cover the entire semiconductor layer 151 that will be the active region of the thin film transistor 150. In this state, from over the substrate 101, a p-type impurity (boron, for example) 125 is doped over the entire substrate 101. The p-type impurity 125 passes through the gate insulating film 105 and is implanted into the semiconductor layer 131. Through this process, p-type impurity 125 is implanted into the region in the semiconductor layer 131 of the thin film diode 130 that is not covered by the mask 124. The p-type impurity 125 is not doped into the region covered by the mask 124. Thus, the region in the semiconductor layer 131 of the thin film diode 130 into which the p-type impurity 125 has been implanted will be the p-type region 131p of the thin film diode 130. The region of the semiconductor layer 131 into which neither the p-type impurity nor the n-type impurity has been implanted will be the intrinsic region 131i.

Figure 3L:
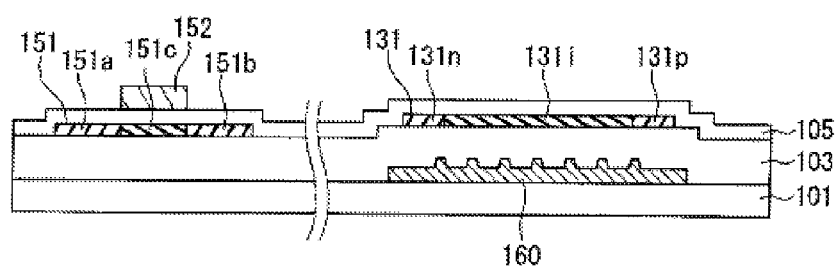
FIG. 3L is a cross-sectional view showing one manufacturing step of the semiconductor device according to Embodiment 1 of the present invention.

Next, as shown in FIG. 3L, after the mask 124 is removed, a heat treatment is conducted under an inert atmosphere, i.e., under a nitrogen atmosphere, for example. With this heat treatment, in the n-type region 131n and the p-type region 131p of the thin film diode 130 and in the source region 151a and the drain region 151b of the thin film transistor 150, doping damages such as crystal defects that occurred during the doping are recovered, and phosphorus and boron, which were doped into the respective regions, are activated. This heat treatment may be conducted using a generally available heating furnace, but is preferably conducted using RTA (Rapid Thermal Annealing). Especially, the system that raises and lowers the temperature instantly by blowing a high-temperature inert gas onto the surface of the substrate 101 is suitable.

Figure 3M:
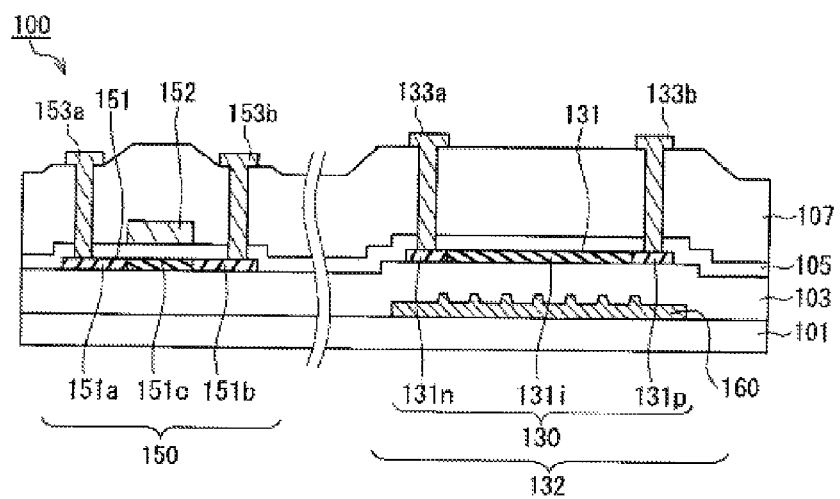
FIG. 3M is a cross-sectional view showing one manufacturing step of the semiconductor device according to Embodiment 1 of the present invention.

Next, as shown in FIG. 3M, an interlayer insulating film 107 is formed. The configuration of the interlayer insulating film 107 is not particularly limited, and various known films can be used. For example, a silicon nitride film and a silicon oxide film may be layered in this order to form a double-layer structure. As necessary, a heat treatment to hydrogenate the semiconductor layers 151 and 131 may be conducted. For example, annealing under 1 atm of nitrogen atmosphere or hydrogen mixture atmosphere may be conducted at 350 to 450° C. Once the interlayer insulating film 107 is formed, contact holes are formed in the interlayer insulating film 107. Next, a film made of metal material (a double-layer film of titanium nitride and aluminum, for example) is formed over the interlayer insulating film 107 and inside the contact holes, and the film is patterned. As a result, electrodes 133a and 133b of the thin film diode 130 and electrodes 153a and 153b of the thin film transistor 150 are formed. Thus, a thin film diode 130 connected to the electrodes 133a and 133b, and a thin film transistor 150 connected to the electrodes 153a and 153b are obtained. Also, for the purpose of protecting the electrodes 133a and 133b connected to the thin film diode 130, and the electrodes 153a and 153b connected to the thin film transistor 150, a protective film (not shown) made of a silicon nitride film or the like may be disposed on the interlayer insulating film 107.

According to the manufacturing method described above, the semiconductor layer 131 of the thin film diode 130 and the semiconductor layer 151 of the thin film transistor 150 can be formed simultaneously. As a result, the thin film diode 130 and the thin film transistor 150 can efficiently be formed on the common substrate 101.

In this manufacturing method, the thickness of the semiconductor layer 131 of the thin film diode 130 necessarily becomes the same as the thickness of the semiconductor layer 151 of the thin film transistor 150. Therefore, the thickness of the semiconductor layer 131 of the thin film diode 130 cannot be increased to improve the light detection sensitivity. However, as discussed above, in the case of the semiconductor device 100 according to an embodiment of the present invention, even if the thickness of the semiconductor layer 131 cannot be increased, the light detection sensitivity of the optical sensor 132 (thin film diode 130) can be improved.

Also, in the manufacturing method described above, because the resist layer 166 is formed with the halftone exposure, depressions and protrusions 160a can directly be formed on the top surface of the light-shielding film 160 integrally with the light-shielding film 160. Therefore, desired depressions and protrusions can be formed on the top surface of the light-shielding film 160 without any significant addition or change of the manufacturing processes.

Further, although the depressions and protrusions are formed on the top surface of the light-shielding layer 160, the surface of the first semiconductor layer 131 facing the light-shielding layer 160 can be made flatter than the surface of the light-shielding layer 160 on which the depressions and protrusions are formed, simply by increasing the thickness of the base layer 103 disposed on the light-shielding layer 160.

Therefore, according to the manufacturing method described above, the semiconductor device 100 can be manufactured easily and at a low cost, without significantly changing the conventional method for manufacturing the semiconductor device.

Meanwhile, as shown in FIG. 3C, the thin film 161 in the region in which the thin film transistor 150 will be formed is removed. As a result, the top surface and the bottom surface of the semiconductor layer 151 constituting the thin film transistor 150 are substantially flat. Therefore, the light detection sensitivity of the thin film diode 130 can be improved without negatively influencing the characteristics of the thin film transistor 150 (reduction in the gate voltage resistance characteristics, for example).

The configuration of the thin film transistor is not limited to the one described above. The thin film transistor may be a thin film transistor having the dual gate structure, a thin film transistor having the LDD structure or GOLD structure, or a p-channel type thin film transistor. Further, multiple kinds of thin film transistors having different structures may be formed.

In the description of the embodiments above, the semiconductor device 100, which includes the optical sensor 132 and the thin film transistor 150, is described as an example. However, the present invention is not limited to this. Only the optical sensor 132 may be included, for example. Also, the semiconductor layers 131 and 151 may be formed of amorphous silicon.

Embodiment 2

As described with reference to FIG. 2, according to the present invention, the light L1 that has passed through the semiconductor layer 131 is reflected at the uneven top surface of the light-shielding layer 160, and therefore the light detection sensitivity of the thin film diode 130 is improved. For this purpose, the arrangement of the depressions and protrusions of the top surface of the light-shielding film 160 is preferably dense. Specifically, the area of the depressions and protrusions and the area of inter-protrusion regions are preferably as equal as possible, and the depressions and protrusions are preferably arranged as close as possible to each other. In the description of Embodiment 2, an example of this arrangement of the depressions and protrusions is discussed.

Figure 4A:
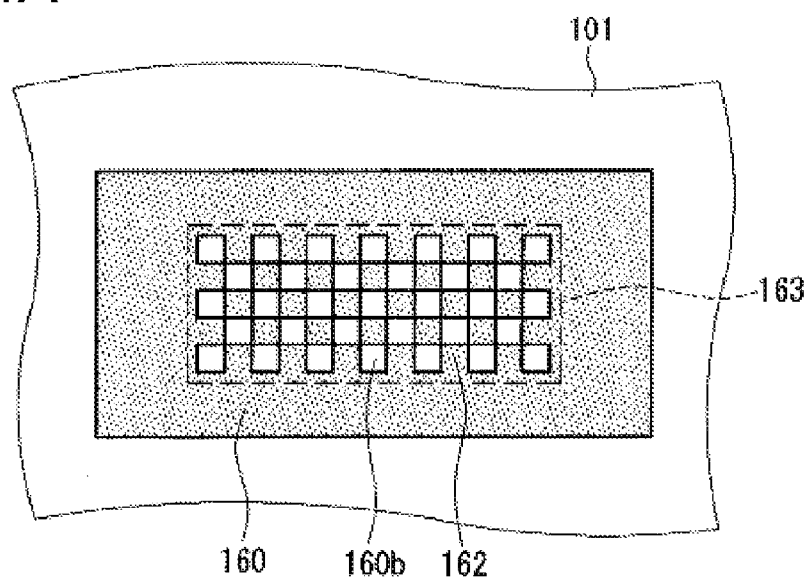
FIG. 4A is a plan view showing a light-shielding film according to Embodiment 2 of the present invention, where depressions and protrusions, which are approximately square when observed in a plan view, are arranged such that they touch each other at their corners.
Figure 4B:
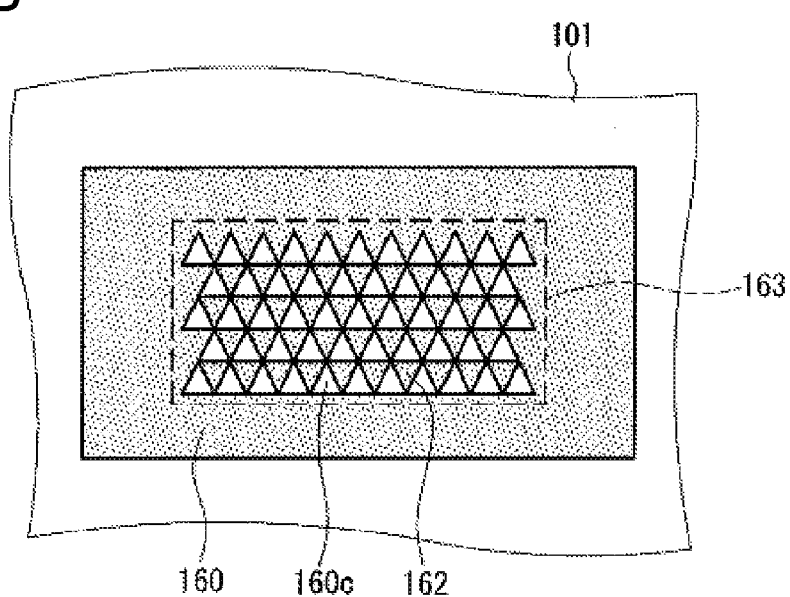
FIG. 4B is a plan view showing the light-shielding film according to Embodiment 2 of the present invention, where depressions and protrusions, which are approximately equilateral triangles when observed in a plan view, are arranged such that they touch each other at their corners.

As shown in FIG. 4A, for example, depressions and protrusions 160b, whose shape is approximately square when observed in a plan view (the shape observed from above), may be arranged in a checker pattern on the top surface of the light-shielding film 160 so that they touch each other at their corners. Alternatively, as shown in FIG. 4B, depressions and protrusions 160c, whose shape is approximately equilateral triangle when observed in a plan view, may be arranged on the top surface of the light-shielding film 160 such that they touch each other at their corners. In FIG. 4A, the area of depressions and protrusions 160b and the area of the inter-protrusion regions (where depressions and protrusions 160b are not formed) 162 in the region 163 of the light-shielding film 160 are approximately the same. Also, in FIG. 4B, the area of depressions and protrusions 160c and the area of the inter-protrusion regions (where depressions and protrusions 160c are not formed) 162 in the region 163 of the light-shielding film 160 are approximately the same. With the arrangements of the depressions and protrusions as shown in FIG. 4A and FIG. 4B, the light detection sensitivity of the thin film diode 130 can further be improved.

Embodiment 2 is the same as Embodiment 1 except for the features discussed above. Similar to Embodiment 1, Embodiment 2 includes of a semiconductor device and an optical sensor.

In the present invention, as the shape of the depressions and protrusions in a plan view, the square as shown in FIG. 3E and FIG. 4A and the equilateral triangle as shown in FIG. 4B are preferable, because with those shapes, a dense arrangement of the depressions and protrusions can easily be obtained. However, the shape of the depressions and protrusions in a plan view is not limited to these. The shape may be selected without limitation; it may be a regular polygon such as regular hexagon or regular octagon, rectangle, rhombus, circle, or ellipse, for example.

Also, the depressions and protrusions may be formed over the entire top surface of the light-shielding film 160, instead of forming them in the limited region 163 of the light-shielding film 160 as shown in FIG. 3E, FIG. 4A, and FIG. 4B.

In the present invention, the cross-sectional shape along the direction of thickness of the depressions and protrusions formed on the top surface of the light-shielding film 160 is not particularly limited, but generally, it is approximately rectangular or approximately trapezoidal shape if the method of formation according to Embodiment 1 is used.

In the present invention, the method for forming the depressions and protrusions on the top surface of the light-shielding film 160 is not limited to the combination of photolithography and etching mentioned in the description of Embodiment 1. Methods other than the combination of photolithography and etching can be used. Depending on the method for forming the depressions and protrusions, the arrangement and shape of the depressions and protrusions may become irregular. Even in such a case, however, the present invention can provide the advantages similar to the one discussed above.

Embodiment 3

Embodiment 3 presents a liquid crystal panel including the semiconductor device having the light detection function discussed in the description of Embodiments 1 and 2.

Figure 5:
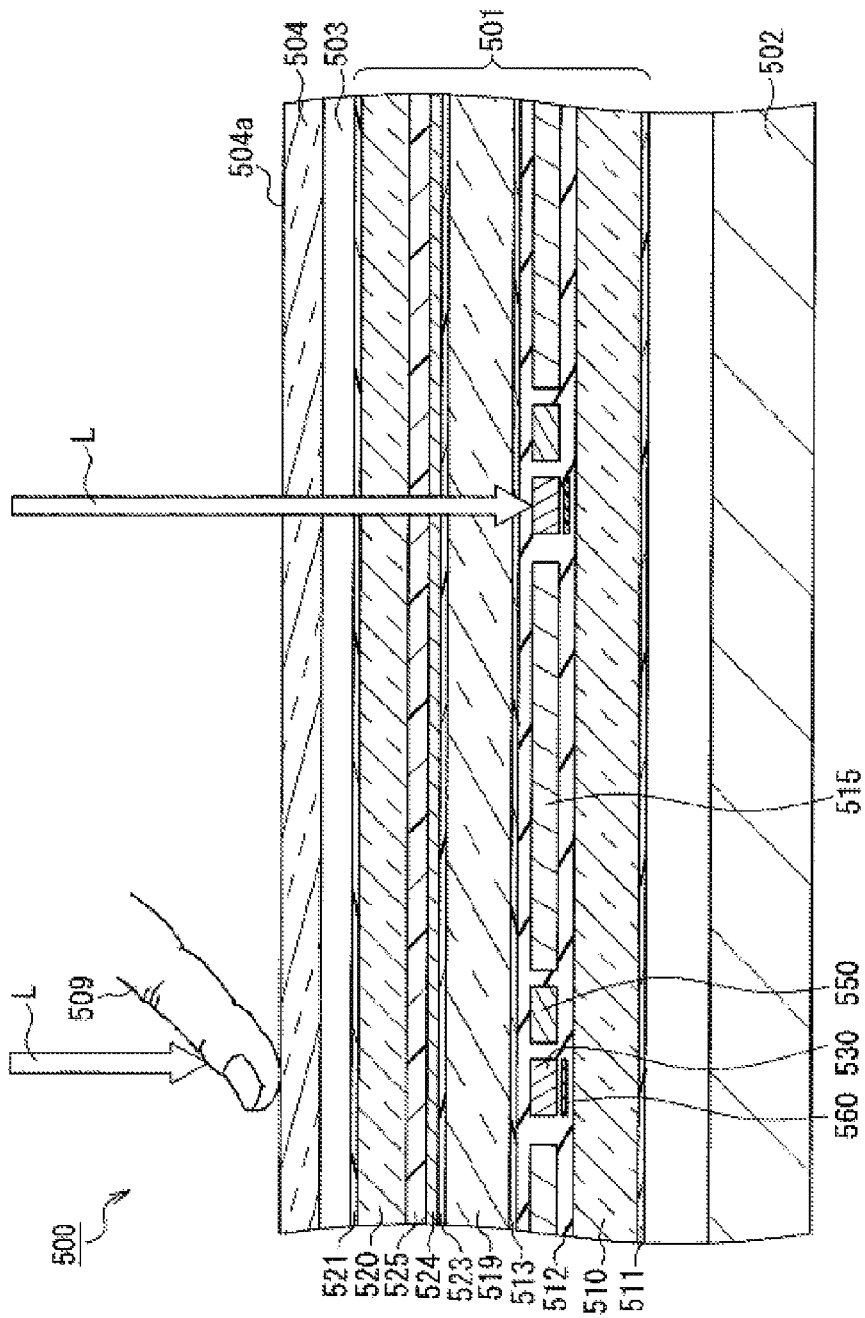
FIG. 5 is a cross-sectional view schematically showing the configuration of a liquid crystal display device including a liquid crystal panel according to Embodiment 3 of the present invention.

FIG. 5 is a cross-sectional view schematically showing a liquid crystal display device 500 that includes a liquid crystal panel 501 according to Embodiment 3.

The liquid crystal display device 500 includes the liquid crystal panel 501, an illumination device 502 that illuminates the back side of the liquid crystal panel 501, and a transparent protective panel 504 disposed over the liquid crystal panel 501 through an air gap 503.

The liquid crystal panel 501 includes a TFT array substrate 510 and an opposite substrate 520, which are both made of a transparent plate-shaped member, and a liquid crystal layer 519 sealed in between the TFT array substrate 510 and the opposite substrate 520. Materials for the TFT array substrate 510 and the opposite substrate 520 are not particularly limited. A material used for conventional liquid crystal panels, for example, such as glass or acrylic resin, can be used.

On the surface of the TFT array substrate 510 facing the illumination device 502, a polarizing plate 511 that transmits or absorbs a particular polarization component is provided. On the surface of the TFT array substrate 510 that is on the opposite side from the polarizing plate 511, an insulating layer 512 and an alignment film 513 are layered in this order. The alignment film 513 is a layer for liquid crystal alignment, and is constituted of an organic thin film such as polyimide. The insulating layer 512 includes a pixel electrode 515 composed of a transparent conductive thin film made of ITO or the like, a thin film transistor (TFT) 550, which is connected to the pixel electrode 515 and functions as the switching element for driving the liquid crystals, and a thin film diode 530 having the light detection function. Also, a light-shielding layer 560 is disposed for the thin film diode 530 on the side facing the illumination device 502.

On the surface of the opposite substrate 520 that is on the side opposite from the liquid crystal layer 519, a polarizing plate 521 that transmits or absorbs a particular polarization component is provided. On the surface of the opposite substrate 520 facing the liquid crystal layer 519, an alignment film 523, a common electrode 524, and a color filter layer 525 are formed in this order from the side of the liquid crystal layer 519. The alignment film 523 is, like the alignment film 513 disposed over the TFT array substrate 510, a layer for liquid crystal alignment, and is constituted of an organic thin film such as polyimide. The common electrode 524 is constituted of a transparent conductive thin film made of ITO or the like. The color filter layer 525 includes three types of resin films (color filters) that selectively transmit the light with a wavelength band of primary colors of red (R), green (G), or blue (B), and a black matrix that functions as the light-shielding film partitioning the adjacent color filters. Preferably, no color filter or black matrix is disposed in the region corresponding to the thin film diode 530.

In the case of the liquid crystal panel 501 of this embodiment, for each of the red, green, or blue primary color filters, one pixel electrode 515 and one thin film transistor 550 are disposed, individually constituting a primary color pixel (a picture element). The three picture elements, red, green, and blue, constitute a color pixel (a pixel). The color pixels are arranged in both the vertical and horizontal directions regularly.

The transparent protective panel 504 is constituted of a flat plate made of glass, acrylic resin, or the like. The surface of the transparent protective panel 504 facing away from the liquid crystal panel 501 is a touch sensor surface 504a that a human finger 509 can touch. The transparent protective panel 504 disposed over the liquid crystal panel 501 through the air gap 503 prevents the pressure that the human finger 509 applies on the transparent protective panel 504 from being transmitted to the liquid crystal panel 501. This prevents undesirable "waves" from appearing on the display as a result of the pressure applied by the finger 509.

The illumination device 502 is not particularly limited. A known illumination device may be used as the illumination device for the liquid crystal panel. A direct type or edge-light type illumination device, for example, may be used. The edge-light type illumination device is suitable to reduce the thickness of the liquid crystal display device 500, and therefore preferable. Also, the light source is not limited to any particular kinds, and it may be a cold or hot cathode tube, or LED, for example.

The liquid crystal display device 500 of this embodiment can display color images by causing the light from the illumination device 502 to pass through the liquid crystal panel 501 and the transparent protective panel 504.

On the other hand, external light L that is projected on the touch sensor surface 504a enters the thin film diode 530. When finger 509 touches the touch sensor surface 505a, the external light L is blocked. Then, the change in the external light L that enters the thin film diode 530 is detected, and as a result, the presence or absence of the touch of finger 509 and the location of the touch on the touch sensor surface 504a can be determined. The light-shielding layer 560 blocks the light from the illumination device 502 from entering the thin film diode 530.

In the configuration described above, the thin film diode 130, thin film transistor 150, the light-shielding layer 160, and the substrate 101, which are explained in the description of Embodiment 1 or 2, may be used as the thin film diode 530, the thin film transistor 550, the light-shielding layer 560, and the TFT array substrate 510, respectively. The insulating layer 512 includes the base layer 103, the gate insulating film 105, the interlayer insulating film 107 and a planarizing film, which are explained in the description of Embodiment 1.

In FIG. 5, a transmissive liquid crystal display device is shown as the liquid crystal display device, but the present invention is not limited to this. The present invention may be applied to transflective and reflective liquid crystal display devices. The illumination device 502 is not necessary for reflective liquid crystal display devices.

Figure 6:
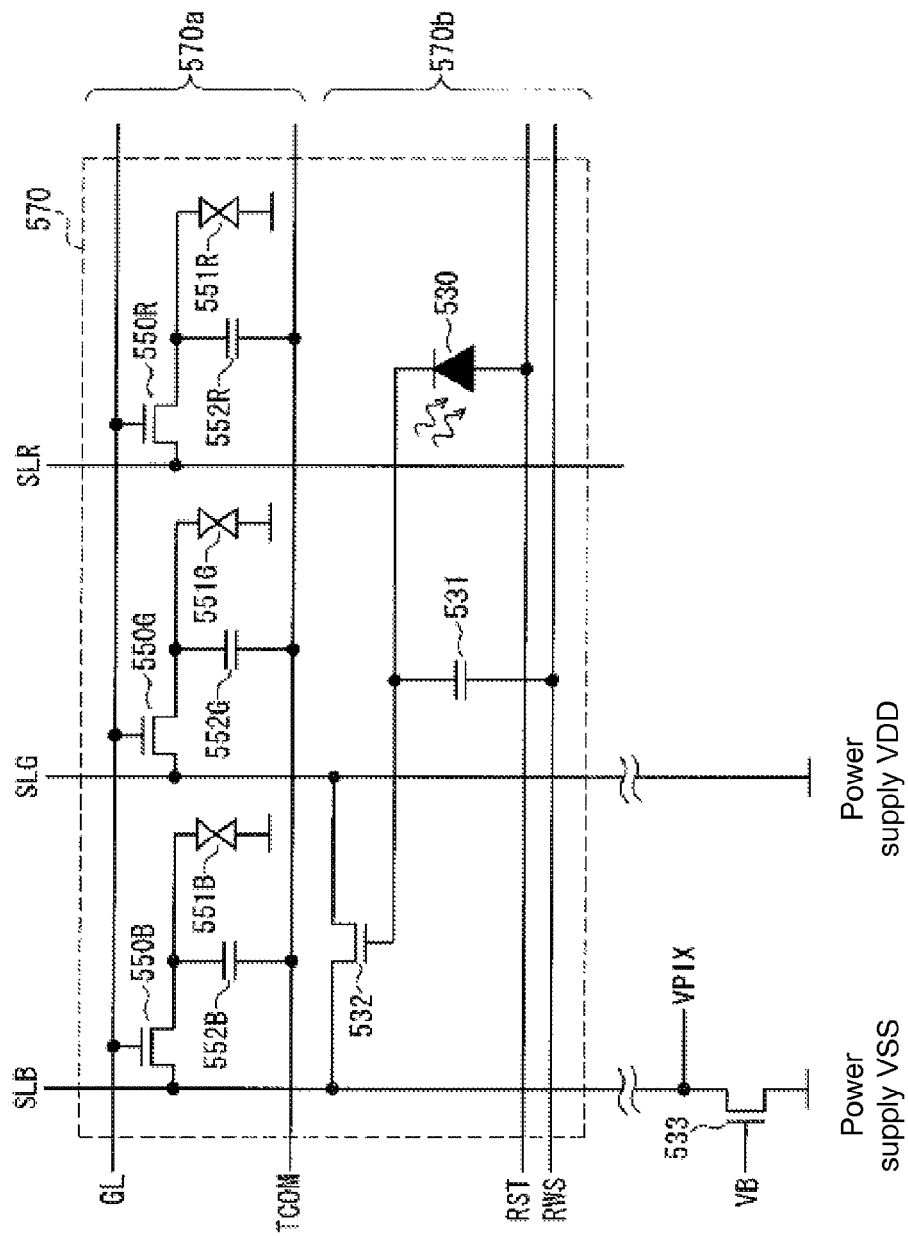
FIG. 6 is an equivalent circuit diagram of a pixel of the liquid crystal panel according to Embodiment 3 of the present invention.

FIG. 6 is an equivalent circuit diagram of a pixel of the liquid crystal panel 501 shown in FIG. 5. The pixel 570 of the liquid crystal panel 501 includes a display section 570a that constitutes a color pixel, and an optical sensor section 570b. A large number of the pixels 570 are disposed in the pixel region of the liquid crystal panel 501 in a matrix, in both the vertical and horizontal directions.

The display section 570a includes: thin film transistors 550R, 550G, and 550B; liquid crystal elements 551R, 551G, and 551B; and capacitances 552R, 552G, and 552B (here, letters "R", "G", and "B" indicate, respectively, the red, green, and blue picture elements constituting a pixel. This terminology applies hereinafter). Source regions of the thin film transistors 550R, 550G, and 550B are connected to source electrode lines (signal lines) SLR, SLG, and SLB, respectively. The gate electrodes are connected to the gate electrode line (scan line) GL. The drain regions are connected to the pixel electrodes of liquid crystal elements 551R, 551G, and 551B (see pixel electrode 515 of FIG. 5), and to one side of the electrodes of the capacitances 552R, 552G, and 552B. The other electrodes of the capacitances 552R, 552G, and 552B are connected to the common electrode line TCOM.

When a positive pulse is applied on the gate electrode line GL, the thin film transistors 550R, 550G, and 550B turn ON. Thus, the signal voltages applied on the source electrode lines SLR, SLG, and SLB are sent from the source electrodes of the thin film transistors 550R, 550G, and 550B to the liquid crystal elements 551R, 551G, and 551B and to the capacitances 552R, 552G, and 552B through the respective drain electrodes. As a result, a voltage is applied on the liquid crystal layer 519 (see FIG. 5) with the pixel electrodes 515 of the liquid crystal elements 551R, 551G, and 551B (see FIG. 5) and the common electrode 524 (see FIG. 5) to change the alignment state of liquid crystals of the liquid crystal layer 519 for desired color displays.

On the other hand, the optical sensor section 570b includes a thin film diode 530, a storage capacitance 531, and a thin film transistor 532. The p+ type region of the thin film diode 530 is connected to the reset signal line RST. The n+ type region of the thin film diode 530 is connected to one of the electrodes of the storage capacitance 531 and the gate electrode of the thin film transistor 532. The other electrode of the storage capacitance 531 is connected to the read-out signal line RWS. The drain electrode of the thin film transistor 532 is connected to the source electrode line SLG. The source electrode of the thin film transistor 532 is connected to the source electrode line SLB. A rated voltage VDD is connected to the source electrode line SLG. The drain electrode of a bias transistor 533 is connected to the source electrode line SLB. A rated voltage VSS is connected to the source electrode of the transistor 533 for biasing.

In the optical sensor section 570b thus configured, the output voltage VPIX corresponding to the amount of the light received by the thin film diode 530 is obtained in the following manner.

First, a HIGH level reset signal is supplied to the reset signal line RST. This makes the thin film diode 530 forward-biased. At this time, the gate electrode potential of the thin film transistor 532 is lower than the threshold voltage of the thin film transistor 532. As a result, the thin film transistor 532 is in a non-conductive state.

Next, the potential of the reset signal line RST is set to LOW. This starts the period for integration of the photo current. During this period of integration, the photo current in proportion to the amount of the light that enters the thin film diode 530 flows out of the storage capacitance 531, and the storage capacitance 531 is discharged. During this period, the potential of the gate electrode of the thin film transistor 532 is still lower than the threshold voltage of the thin film transistor 532. As a result, the thin film transistor 532 remains in the non-conductive state.

Next, a HIGH read-out signal is supplied to the read-out signal line RWS. This stops the integration period, and the read-out period starts. The supply of read-out signal causes the charges to be stored at the storage capacitance 531, and the potential of the gate electrode of the thin film transistor 532 becomes higher than the threshold voltage of the thin film transistor 532. As a result, the thin film transistor 532 becomes conductive, and functions as the source follower amplifier together with the bias transistor 533. The output voltage VPIX obtained from the thin film transistor 532 is proportional to the value of the photo current at the thin film diode 530 integrated during the integration period.

Next, the potential of the read-out signal line RWS is set to LOW, and the read-out period ends.

The operation described above is repeated sequentially at all pixels 570 located in the pixel region of the liquid crystal panel 501 to realize a touch sensor function in the pixel region of the liquid crystal panel 501.

By using the thin film diode 130 described in the descriptions of Embodiment 1 and Embodiment 2 as the thin film diode 530, the liquid crystal display device 500 that has a touch sensor function with good light detection sensitivity can be realized.

In FIG. 6, one optical sensor section 570b is provided for one display section 570a constituting a color pixel, but the present invention is not limited to this. For example, one optical sensor section 570b may be provided for a plurality of display sections 570a. Alternatively, one optical sensor section 570b may be provided for each of the red, blue and green picture elements in a display section 570a. Also, FIG. 6 shows an example where the present invention is applied to a liquid crystal panel that performs the color display. However, the present invention may be applied to a liquid crystal panel that performs the monochrome display.

FIG. 5 and FIG. 6 shows a case where the thin film transistor 150 of Embodiment 1 and Embodiment 2 is used as the thin film transistors 550 (550R, 550G, and 550B) provided for each of the corresponding picture elements. However, the present invention is not limited to this. It may be a transistor other than the thin film transistor 550 (550R, 550G, and 550B). Alternatively, it may be a thin film transistor for the driver circuit (a gate driver 510g or a source driver 510s described below), for example.

Figure 7:
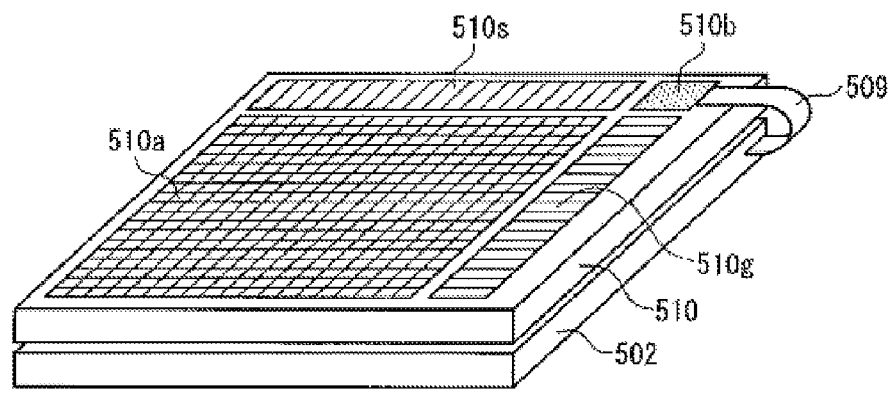
FIG. 7 is a perspective view showing the main section of another liquid crystal display device according to Embodiment 3 of the present invention.
Figure 8:
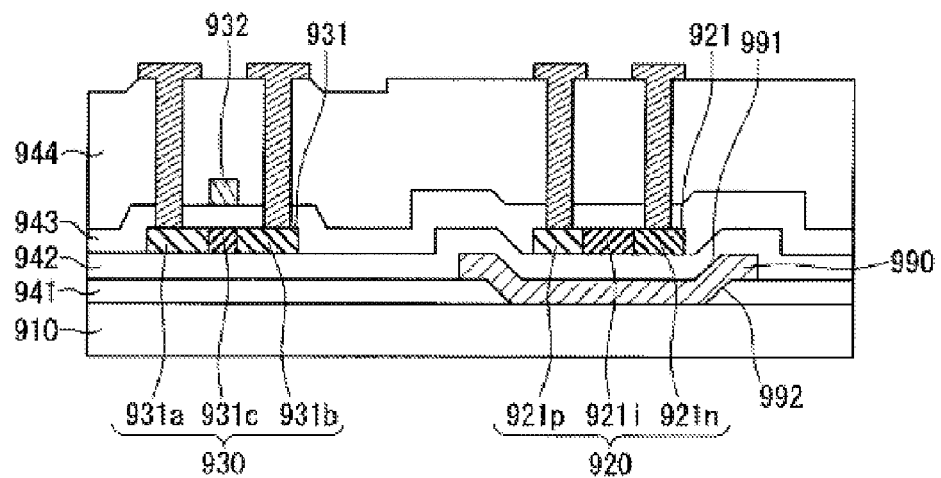
FIG. 8 is a cross-sectional view showing a conventional semiconductor device including a thin film diode and a thin film transistor.

In FIG. 5 and FIG. 6, an optical sensor of the present invention with the light detection function is disposed in the pixel region of the TFT array substrate 510, where a number of thin film transistors 550 for driving the liquid crystals are arranged in a matrix. However, the present invention is not limited to this. For example, the optical sensors may be disposed outside the pixel region of the TFT array substrate 510. An example of positioning the optical sensors outside the pixel region of the TFT array substrate 510 is described with reference to FIG. 7. FIG. 7 shows, among constituting members of a liquid crystal display device, only the TFT array substrate 510 and the illumination device 502 that illuminates the back side of the TFT array substrate 510. The TFT array substrate 510 includes a pixel region 510a in which a number of thin film transistors for driving the liquid crystals are arranged in a matrix. In the frame region bordering the pixel region 510a, a gate driver 510g, a source driver 510s, and a light detection section 510b are disposed. In the light detection section 510b, the optical sensors 132 (thin film diode 130 and light-shielding layer 160) described in Embodiment 1 and Embodiment 2 are formed. The thin film diodes 130 of the light detection section 510b generate the illuminance signal representing the ambient brightness. This illuminance signal is inputted to the control circuit (not shown) of the illumination device 502 through a wiring 509 such as a flexible substrate or the like. The control circuit controls the luminance of the illumination device 502 according to the illuminance signal. As a result, a liquid crystal display device in which the display brightness is appropriately and automatically adjusted according to the ambient brightness can be realized. This way, the optical sensor 132 (the thin film diode 130 and the light-shielding layer 160) according to an embodiment of the present invention may be disposed in the frame region of the TFT array substrate 510 to be used as the ambient sensor for detecting the ambient brightness. Because the thin film diode 130 constituting the optical sensor 132 according to an embodiment of the present invention has good light detection sensitivity, a liquid crystal display device in which the display brightness is optimized according to the ambient brightness can be realized. Further, compared to the case where the thin film diode 130 is formed in the pixel region, the thin film diode 130 can be made larger. As a result, the light detection sensitivity can further be improved easily by increasing the area of the light-receiving region.

Although Embodiment 3 shows an example of the application of a semiconductor device of the present invention as described in Embodiment 1 and Embodiment 2 to a liquid crystal panel, the application of the semiconductor device of the present invention is not limited to this. The semiconductor device of the present invention may be used for display elements of the EL panel, plasma panel, and the like. It can also be used for a variety of devices, other than the display elements, that have a light detection function.

INDUSTRIAL APPLICABILITY

The application field of the present invention is not particularly limited. The present invention can be applied to a wide variety of devices that require an optical sensor with improved detection sensitivity. In particular, the present invention can suitably be used for a variety of display elements as a touch sensor or an ambient sensor for detecting the ambient brightness.

The invention claimed is:
1. An optical sensor comprising:
a substrate;
a thin film diode disposed on one side of said substrate and including a first semiconductor layer having at least an n-type region and a p-type region; and
a light-shielding layer disposed between said substrate and said first semiconductor layer,
wherein depressions and protrusions are formed on a surface of said light-shielding layer that is facing said first semiconductor layer,
wherein a surface of said first semiconductor layer that is facing said light-shielding layer is flatter than the surface of said light-shielding layer on which said depressions and protrusions are formed, and
wherein a difference in height between a top and a base of said depressions and protrusions formed on the surface of said light-shielding layer facing said first semiconductor layer is 50 to 100 nm.

2. The optical sensor according to claim 1, wherein a difference between a top and a base of the surface of said first semiconductor layer facing said light-shielding layer is no more than 1/10 of a thickness of said first semiconductor layer.

3. The optical sensor according to claim 1, further comprising an insulating layer having a thickness of at least 500 nm disposed between said light-shielding layer and said first semiconductor layer.

4. The optical sensor according to claim 1, wherein an entire surface of said light-shielding layer facing said first semiconductor layer has the depressions and protrusions formed thereon.

5. The optical sensor according to claim 1, wherein said depressions and protrusions are arranged regularly.

6. A semiconductor device comprising:
the optical sensor according to claim 1; and
a thin film transistor disposed on said substrate on a same side of said substrate as said thin film diode,
wherein said thin film transistor has a second semiconductor layer including a channel region, a source region, and a drain region; a gate electrode that controls a conductivity of said channel region; and a gate insulating film disposed between said second semiconductor layer and said gate electrode.

7. The semiconductor device according to claim 6, wherein said first semiconductor layer and said second semiconductor layer are formed on a same insulating layer.

8. The semiconductor device according to claim 6, wherein a surface of said second semiconductor layer that faces said substrate is flat.

9. The semiconductor device according to claim 6, wherein the thickness of said first semiconductor layer and the thickness of said second semiconductor layer are equal.

10. A liquid crystal panel comprising:
the semiconductor device according to claim 6;
an opposite substrate disposed facing the surface of said substrate on which said thin film diode and said thin film transistor are disposed; and
a liquid crystal layer sealed in between said substrate and said opposite substrate.

11. The optical sensor comprising:
a substrate;
a thin film diode disposed on one side of said substrate and including a first semiconductor layer having at least an n-type region and a p-type region; and
a light-shielding layer disposed between said substrate and said first semiconductor layer,
wherein depressions and protrusions are formed on a surface of said light-shielding layer that is facing said first semiconductor layer,
wherein a surface of said first semiconductor layer that is facing said light-shielding layer is flatter than the surface of said light-shielding layer on which said depressions and protrusions are formed, and
wherein a difference between a top and a base of the surface of said first semiconductor layer facing said light-shielding layer is no more than 1/10 of a thickness of said first semiconductor layer.

12. The optical sensor comprising:
a substrate;
a thin film diode disposed on one side of said substrate and including a first semiconductor layer having at least an n-type region and a p-type region; and
a light-shielding layer disposed between said substrate and said first semiconductor layer,
wherein depressions and protrusions are formed on a surface of said light-shielding layer that is facing said first semiconductor layer, and
wherein a surface of said first semiconductor layer that is facing said light-shielding layer is flatter than the surface of said light-shielding layer on which said depressions and protrusions are formed,
further comprising an insulating layer having a thickness of at least 500 nm disposed between said light-shielding layer and said first semiconductor layer.

* * * * *